United States Patent
Chen

(10) Patent No.: US 9,299,859 B2
(45) Date of Patent: Mar. 29, 2016

(54) CAPACITOR STRUCTURE APPLIED TO INTEGRATED CIRCUIT

(75) Inventor: Tien-Lung Chen, Taoyuan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 408 days.

(21) Appl. No.: 13/273,239

(22) Filed: Oct. 14, 2011

(65) Prior Publication Data
US 2013/0056813 A1 Mar. 7, 2013

(30) Foreign Application Priority Data
Sep. 6, 2011 (TW) .............................. 100132139 A

(51) Int. Cl.
| H01L 27/108 | (2006.01) |
| H01L 29/94 | (2006.01) |
| H01L 23/522 | (2006.01) |
| H01L 27/01 | (2006.01) |
| H01L 49/02 | (2006.01) |

(52) U.S. Cl.
CPC ............ *H01L 29/94* (2013.01); *H01L 23/5223* (2013.01); *H01L 27/016* (2013.01); *H01L 28/60* (2013.01); *H01L 2924/0002* (2013.01)

(58) Field of Classification Search
CPC .............. H01L 23/5223; H01L 27/016; H01L 27/0805; H01L 29/94; H01L 29/93; H01L 28/87; H01L 28/60; H01L 2924/0002
See application file for complete search history.

(56) References Cited

U.S. PATENT DOCUMENTS

| 2007/0075397 | A1* | 4/2007 | Zhang | H01L 23/5223 257/532 |
| 2007/0181918 | A1* | 8/2007 | Wada | H01L 23/5223 257/288 |
| 2009/0014832 | A1* | 1/2009 | Baumgartner | H01L 23/5223 257/532 |
| 2012/0061739 | A1* | 3/2012 | Kim | H01L 23/5223 257/296 |

FOREIGN PATENT DOCUMENTS

TW 201019422 5/2010

OTHER PUBLICATIONS

"Office Action of Taiwan counterpart application" issued on Dec. 24, 2013, p. 1-p. 5.

\* cited by examiner

*Primary Examiner* — Vongsavanh Sengdara
(74) *Attorney, Agent, or Firm* — Jianq Chyun IP Office

(57) ABSTRACT

A capacitor structure applied to an integrated circuit (IC) is provided. The capacitor structure includes a metal-oxide semiconductor (MOS) capacitor and two metal structures with different structures. The MOS capacitor has a first terminal and a second terminal. The two metal capacitors are formed above the MOS capacitor and respectively coupled between the first terminal and the second terminal. Subject to the confined chip area, the capacitance of the above-mentioned capacitor structure can still reach the design value, and the above-mentioned capacitor structure is further characterized by a large amount of current flow.

14 Claims, 7 Drawing Sheets

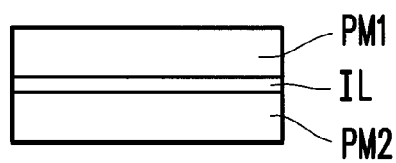
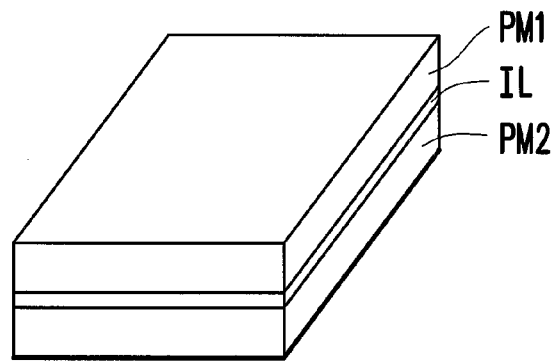
FIG. 2A  FIG. 2B
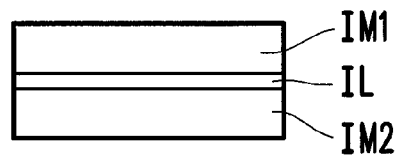
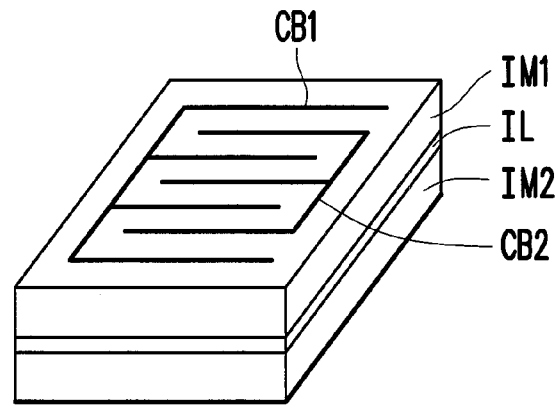
FIG. 3A  FIG. 3B

CAPACITOR STRUCTURE APPLIED TO INTEGRATED CIRCUIT

CROSS-REFERENCE TO RELATED APPLICATION

This application claims the priority benefit of Taiwan application serial no. 100132139, filed on Sep. 6, 2011. The entirety of the above-mentioned patent application is hereby incorporated by reference herein and made a part of this specification.

BACKGROUND OF THE INVENTION

1. Technology Field

The present invention generally relates to a semiconductor structure, and more particularly to a capacitor structure applied to an integrated circuit (IC).

2. Description of Related Art

With the increase in the level of integration of the semiconductor device, dimensions of the device are gradually reduced. Hence, space occupied by the capacitor is relatively reduced because the available chip area of the capacitor plate is forced to decrease. This leads to reduction of the capacitance of the capacitor. After entry into the deep sub-micron fabrication phase, the issue of the capacitance reduction of the capacitor becomes more serious.

SUMMARY OF THE INVENTION

In view of the above, the invention is directed to a capacitor structure applied to an integrated circuit (IC). Subject to the confined chip area, the capacitance of the capacitor structure can still reach the design value. Besides, unlike the conventional interdigitated metal capacitor, the capacitor structure of this invention is further characterized by a large amount of current flow.

In an embodiment of the invention, a capacitor structure applied to an integrated circuit (IC) is provided. The capacitor structure includes a metal-oxide semiconductor (MOS) capacitor and two metal capacitors with different structures. The MOS capacitor has a first terminal and a second terminal. The two metal capacitors are formed above the MOS capacitor and respectively coupled between the first terminal and the second terminal.

According to an embodiment of the invention, the metal capacitors with the different structures include a first metal capacitor and a second metal capacitor. The first metal capacitor may be a multi-level plate metal capacitor, and the second metal capacitor may be a multi-level interdigitated metal capacitor.

Here, a multi-level plate metal capacitor and a multi-level interdigitated metal capacitor are fabricated above the MOS capacitor in the capacitor structure described in the invention. Thereby, due to the relatively large cross-section area of the multi-level plate metal capacitor, the capacitor structure described in the invention has a relatively large amount of current flow in comparison with the capacitor structure merely equipped with the interdigitated metal capacitor, given that the available chip area in these two capacitor structures is the same. In addition, the circumference of the multi-level interdigitated metal capacitor is relatively long. Therefore, given that the available chip area in the capacitor structure of this invention and in the capacitor structure merely having the plate metal capacitor remains unchanged, the capacitance of the capacitor structure described in this invention can reach the design value even though the chip area is confined.

It should be understood, however, that this Summary may not contain all of the aspects and embodiments of the invention, that this Summary is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A and FIG. 2B are schematic views respectively illustrating a plate metal capacitor.

FIG. 3A and FIG. 3B are schematic views respectively illustrating an interdigitated metal capacitor.

DESCRIPTION OF THE EMBODIMENTS

Figure 1:
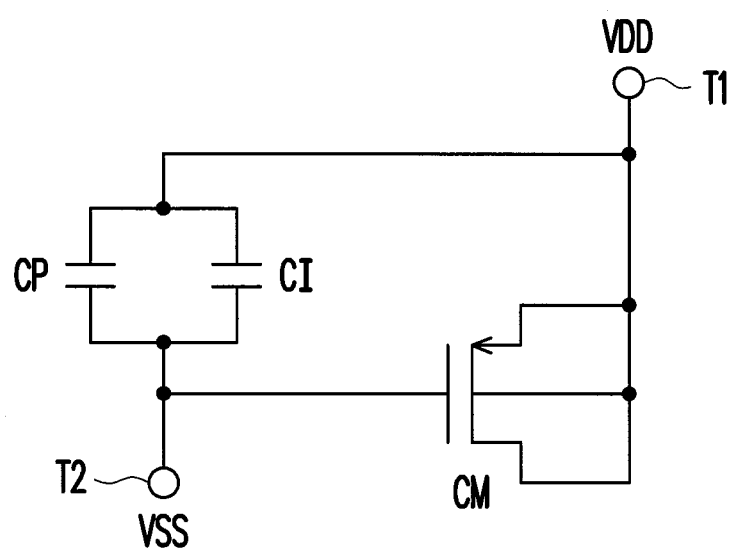
FIG. 1 is an equivalent circuit diagram illustrating a capacitor structure 10 applied to an integrated circuit (IC) according to an embodiment of the invention.

References will now be made in detail to the exemplary embodiments of the invention, examples of which are illustrated in the accompanying drawings. Wherever possible, the same reference numbers are used in the drawings and the description to refer to the same or like parts.

FIG. 1 is an equivalent circuit diagram illustrating a capacitor structure 10 applied to an integrated circuit (IC) according to an embodiment of the invention. With reference to FIG. 1, the capacitor structure 10 includes a metal-oxide semiconductor (MOS) capacitor CM and two metal capacitors CP and CI both with different structures. The MOS capacitor CM has a first terminal T1 and a second terminal T2. The first terminal T1 may be coupled to a first voltage, e.g., a system voltage VDD or a positive supply voltage. The second terminal T2 may be coupled to a second voltage, e.g., a ground voltage VSS or a negative supply voltage. Namely, compared to the voltage coupled to the second terminal T2, the voltage coupled to the first terminal T1 has a relatively high voltage level. As clearly shown in FIG. 1, the MOS capacitor CM is implemented by a P-type MOS transistor.

Besides, in the process of fabricating the capacitor structure 10, the metal capacitors CP and CI with different structures are formed above the MOS capacitor CM and respectively coupled between the first terminal T1 and the second terminal T2. That is to say, the metal capacitors CP and CI with different structures are fabricated on the MOS capacitor CM. In this embodiment, the metal capacitors CP and CI with different structures are a first metal capacitor CP and a second metal capacitor CI, respectively. The first metal capacitor CP may be a multi-level plate metal capacitor, so the first metal capacitor CP is hereinafter referred to as "the plate metal capacitor CP", and the second metal capacitor CI may be a multi-level interdigitated metal capacitor, so the second metal capacitor CI is hereinafter referred to as "the interdigitated metal capacitor CI".

It should be mentioned that the so-called "multi-level plate metal capacitor" is formed by vertically stacking multi-level plate metal electrodes, and an isolation layer is located between the levels. As indicated in FIG. 2A and FIG. 2B, two levels of plate metal electrodes PM1 and PM2 are vertically stacked together, and an isolation layer IL is located between the two levels of the plate metal electrodes PM1 and PM2. Here, the isolation layer IL is made of a dielectric material, for instance. Thereby, the plate metal capacitor can be formed.

Moreover, the so-called "multi-level interdigitated metal capacitor" is formed by vertically stacking multi-level interdigitated metal electrodes, and an isolation layer is located between the levels. Here, the isolation layer is made of a dielectric material, for instance. Each level of interdigitated metal electrode is constituted by interdigitating two comb-like metal electrodes. As indicated in FIG. 3A and FIG. 3B, two levels of the interdigitated metal electrodes IM1 and IM2 are vertically stacked together, and an isolation layer IL is located between the two levels of interdigitated metal electrodes IM1 and IM2. Here, each of the two levels of interdigitated metal electrodes IM1 and IM2 is constituted by interdigitating two comb-like metal electrodes CB1 and CB2. Thereby, the interdigitated metal capacitor can be formed.

Figure 4A:
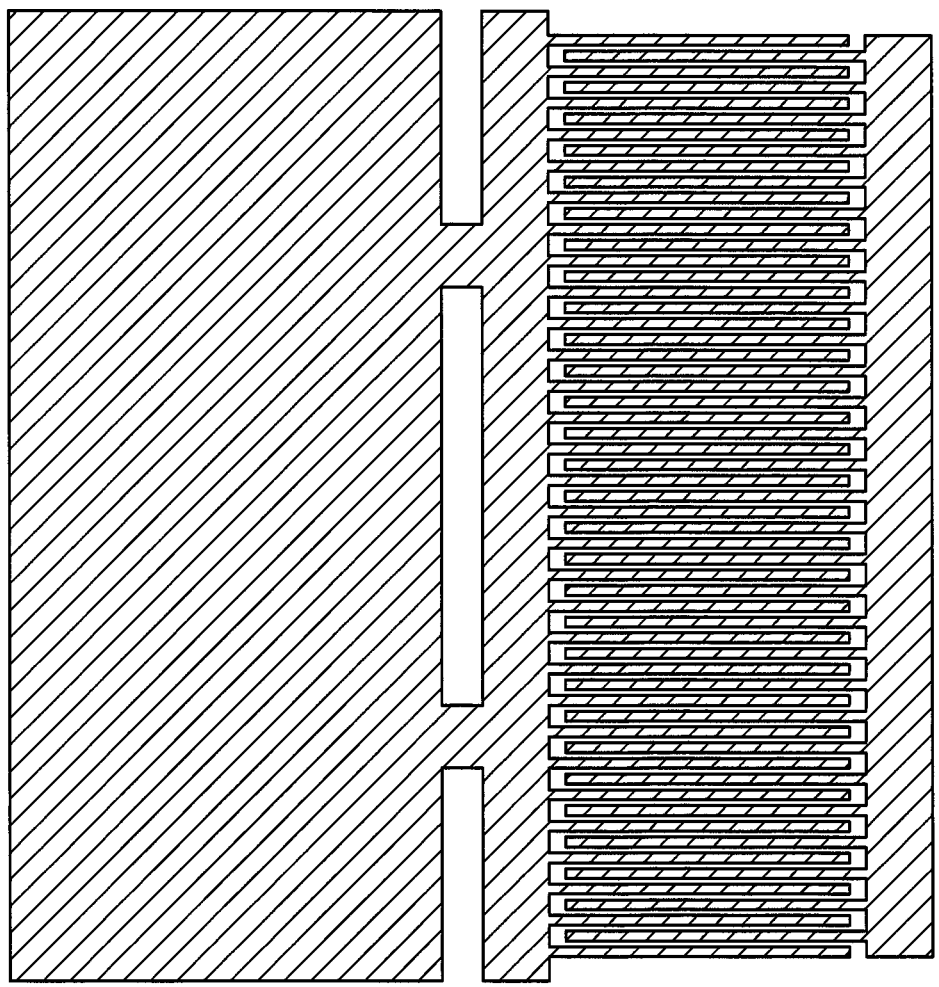
FIG. 4A is a schematic view illustrating a layout of a first level of plate metal electrode in a plate metal capacitor CP and a first level of interdigitated metal electrode in an interdigitated metal capacitor CI of the capacitor structure 10.
Figure 4B:
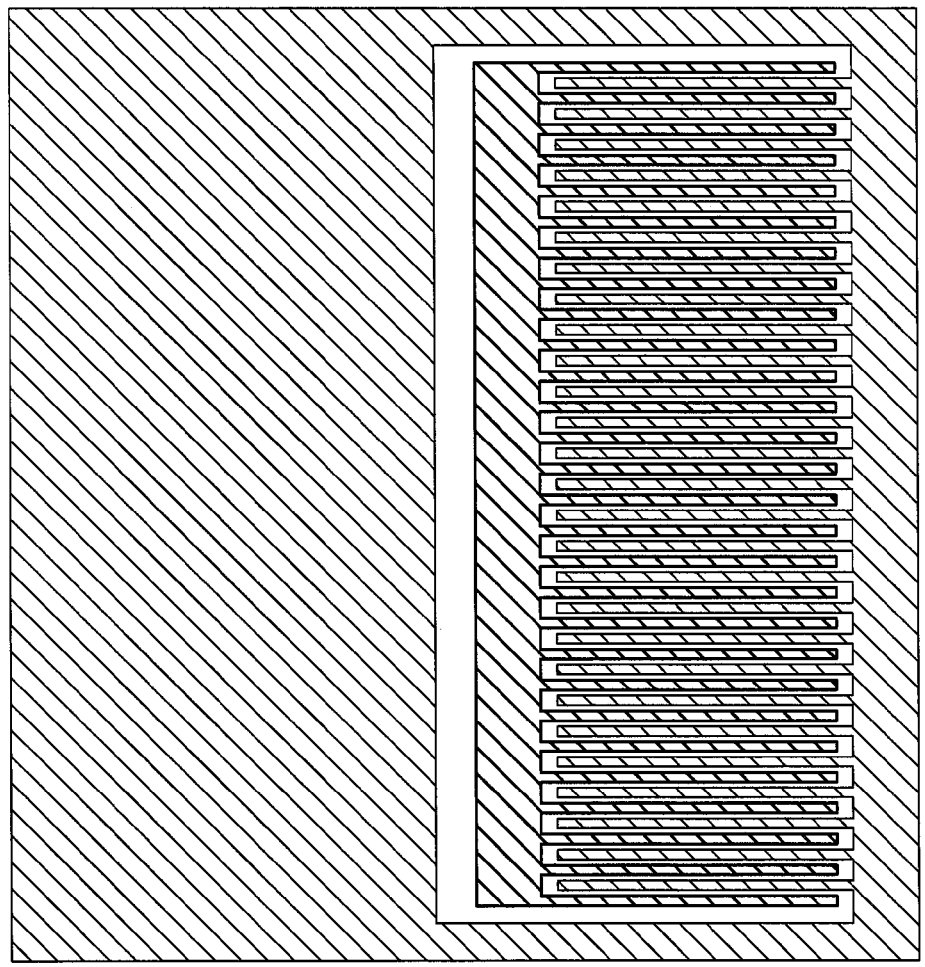
FIG. 4B is a schematic view illustrating a layout of a second level of plate metal electrode in the plate metal capacitor CP and a second level of interdigitated metal electrode in the interdigitated metal capacitor CI of the capacitor structure 10.
Figure 4C:
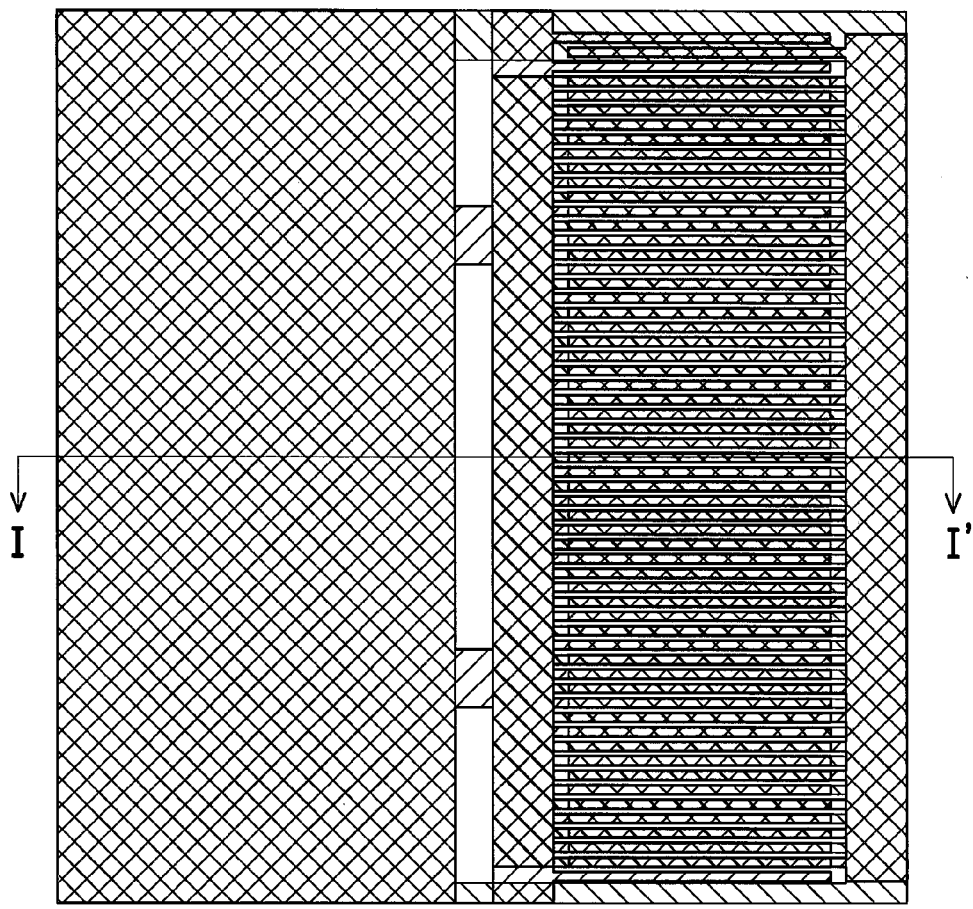
FIG. 4C is a schematic view illustrating an overall layout of the capacitor structure 10.

To further elaborate this embodiment, the plate metal capacitor CP is assumed to be comprised of two levels of plate metal electrodes, and the interdigitated metal capacitor CI is assumed to be comprised of two levels of interdigitated metal electrodes, which should not be construed as limitations to the invention. Specifically, FIG. 4A is a schematic view illustrating a layout of the first level of plate metal electrode in the plate metal capacitor CP and the first level of interdigitated metal electrode in the interdigitated metal capacitor CI of the capacitor structure 10; FIG. 4B is a schematic view illustrating a layout of the second level of plate metal electrode in the plate metal capacitor CP and the second level of interdigitated metal electrode in the interdigitated metal capacitor CI of the capacitor structure 10; FIG. 4C is a schematic view illustrating an overall layout of the capacitor structure 10.

Figure 5:
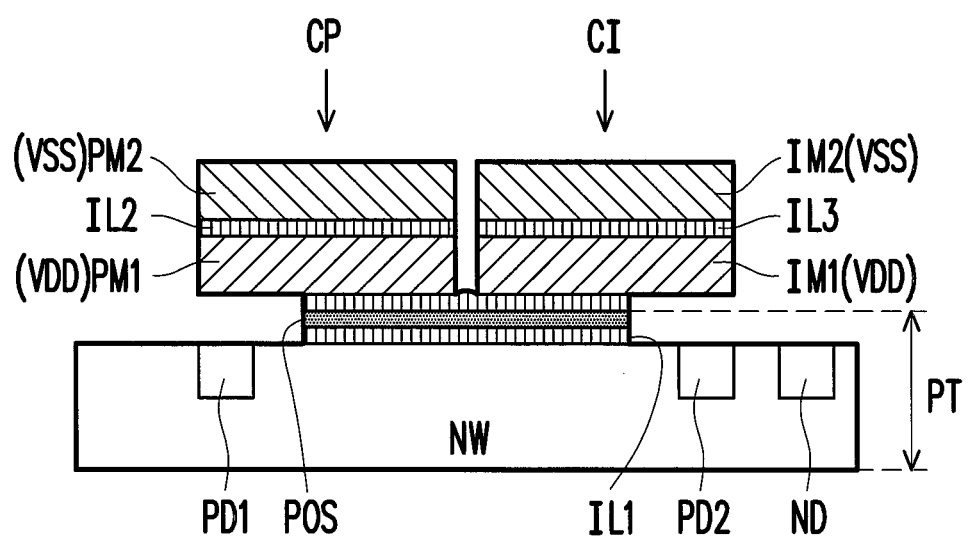
FIG. 5 is a cross-sectional view taken along a cross-sectional line I-I' depicted in FIG. 4C; namely, FIG. 5 schematically shows the configuration of the capacitor structure 10.

With reference to FIG. 4A to FIG. 4C, the left half layout area corresponds to the plate metal capacitor CP, while the right half layout area corresponds to the interdigitated metal capacitor CI. FIG. 5 is a cross-sectional view taken along a cross-sectional line I-P depicted in FIG. 4C. As indicated in FIG. 5, according to this embodiment, the MOS capacitor CM is implemented by a P-type MOS transistor PT, and thus the P-type MOS transistor PT includes an N-well NW, two P-type doped areas PD1 and PD2, at least one N-type doped area ND, a poly-silicon layer POS, and an isolation layer IL1.

The P-type doped area PD1 is located/disposed in the N-well NW and coupled to the first terminal T1 (VDD) so as to serve as a drain of the P-type MOS transistor PT. The P-type doped area PD2 is located/disposed in the N-well NW and coupled to the first terminal T1 (VDD) so as to serve as a source of the P-type MOS transistor PT. The N-type doped area ND is located/disposed in the N-well NW and coupled to the first terminal T1 (VDD) so as to serve as a body of the P-type MOS transistor PT. The poly-silicon layer POS is located/disposed on the N-well NW and coupled to the second terminal T2 (VSS) so as to serve as a gate of the P-type MOS transistor PT. The isolation layer IL1 is located/disposed between the N-well NW and the poly-silicon layer POS.

Besides, the plate metal capacitor CP includes a first level of plate metal electrode PM1, a second level of plate metal electrode PM2, and an isolation layer IL2. The first level of plate metal electrode PM1 is located/disposed on the poly-silicon layer POS and coupled to the first terminal T1 (VDD). The second level of plate metal electrode PM2 is (vertically) configured/disposed on the first level of plate metal electrode PM1 and coupled to the second terminal T2 (VSS). The isolation layer IL2 is located between the first level of plate metal electrode PM1 and the second level of plate metal electrode PM2.

Besides, the interdigitated metal capacitor CI includes a first level of interdigitated metal electrode IM1, a second level of interdigitated metal electrode IM2, and an isolation layer IL3. The first level of interdigitated metal electrode IM1 and the first level of plate metal electrode PM1 are located/disposed in the same metal layer. The first level of interdigitated metal electrode IM1 is configured/disposed on the poly-silicon layer POS, and coupled to the first terminal T1 (VDD). The second level of interdigitated metal electrode IM2 and the second level of plate metal electrode PM2 are located/disposed in the same metal layer. The second level of interdigitated metal electrode IM2 is (vertically) configured/disposed on the first level of interdigitated metal electrode IM1, and coupled to the second terminal T2 (VSS). The isolation layer IL3 is located between the first level of interdigitated metal electrode IM1 and the second level of interdigitated metal electrode IM2.

As described above, the plate metal capacitor CP and the interdigitated metal capacitor CI with different structures are fabricated/formed above the MOS capacitor CM. Thereby, due to the relatively large cross-section area of the multi-level plate metal capacitor, the capacitor structure 10 described in this embodiment has a relatively large amount of current flow in comparison with the capacitor structure merely equipped with the interdigitated metal capacitor, given that the available chip area in these two capacitor structures is the same. In addition, the circumference of the multi-level interdigitated metal capacitor is relatively long. Therefore, given that the available chip area in the capacitor structure 10 described in this embodiment and the available chip area in the capacitor structure merely having the plate metal capacitor remain unchanged, the capacitance of the capacitor structure 10 described in this embodiment can reach the design value even though the chip area is confined.

Figure 6:
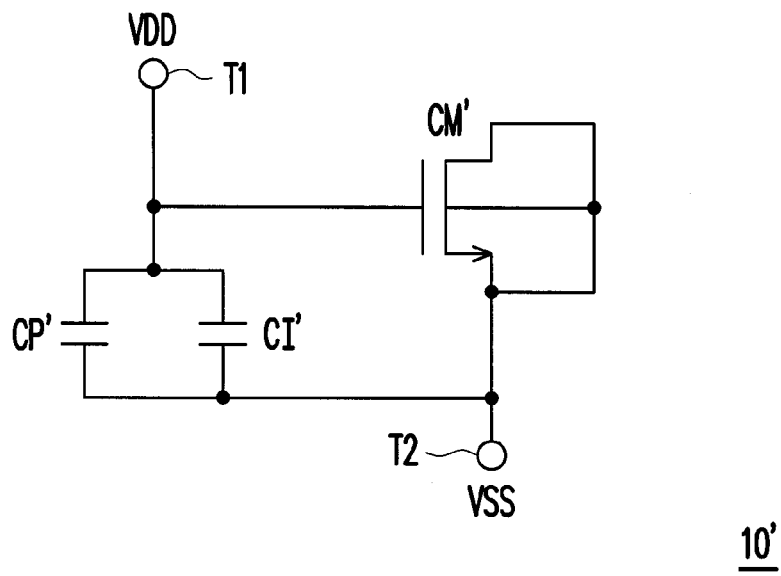
FIG. 6 illustrates a structural variation in the capacitor structure 10 depicted in FIG. 1.

FIG. 6 illustrates a structural variation in the capacitor structure 10 depicted in FIG. 1. With reference to FIG. 1 and FIG. 6, the capacitor structure 10' depicted in FIG. 6 also includes an MOS capacitor CM' and two metal capacitors CP' and CI' with different structures. However, as clearly shown in FIG. 6, the MOS capacitor CM' is implemented by an N-type MOS transistor. Similarly, in the process of fabricating the capacitor structure 10', the metal capacitors CP' and CI' with different structures are fabricated/formed above the MOS capacitor CM', and the metal capacitors CP' and CI' with different structures can be a multi-level plate metal capacitor and a multi-level interdigitated metal capacitor, respectively.

Figure 7:
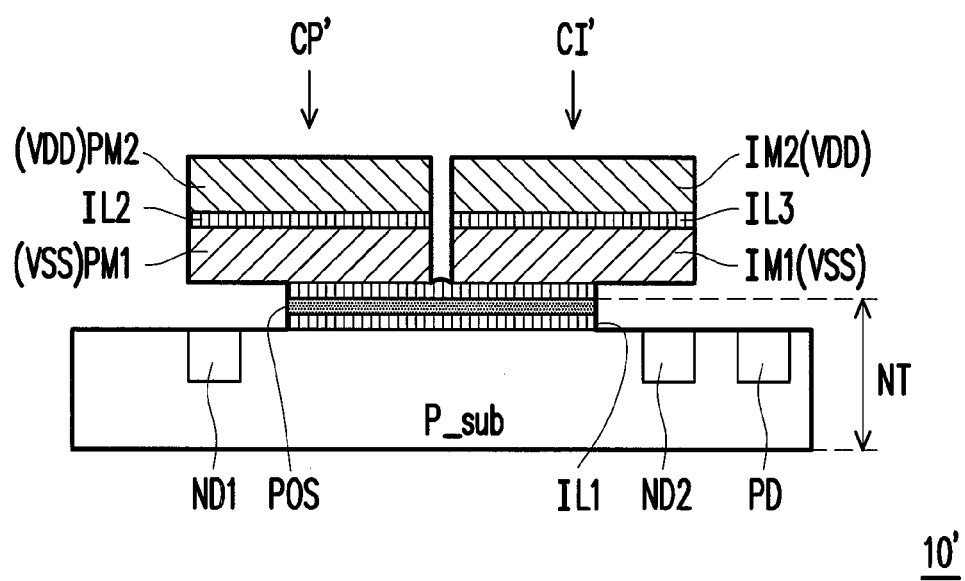
FIG. 7 illustrates the configuration of the capacitor structure 10' depicted in FIG. 6.

FIG. 7 illustrates the configuration of the capacitor structure 10' correspondingly depicted in FIG. 6. With reference to FIG. 6 and FIG. 7, in this embodiment, the MOS capacitor CM' is implemented by an N-type MOS transistor NT, and thus the N-type MOS transistor NT includes a P-type substrate P-sub, two N-type doped areas ND1 and ND2, at least one P-type doped area PD, a poly-silicon layer POS, and an isolation layer IL1.

The N-type doped area ND1 is located/disposed in the P-type substrate P-sub and coupled to the second terminal T2 (VSS) so as to serve as a drain of the N-type MOS transistor NT. The N-type doped area ND2 is located/disposed in the P-type substrate P-sub and coupled to the second terminal T2 (VSS) so as to serve as a source of the N-type MOS transistor NT. The P-type doped area PD is located/disposed in the P-type substrate P-sub and coupled to the second terminal T2 (VSS) so as to serve as a body of the N-type MOS transistor NT. The poly-silicon layer POS is located/disposed on the P-type substrate P-sub and coupled to the first terminal T1 (VDD) so as to serve as a gate of the N-type MOS transistor NT. The isolation layer IL1 is located/disposed between the P-type substrate P-sub and the poly-silicon layer POS.

The plate metal capacitor CP' includes a first level of plate metal electrode PM1, a second level of plate metal electrode PM2, and an isolation layer IL2. The first level of plate metal electrode PM1 is located/disposed on the poly-silicon layer POS and coupled to the second terminal T2 (VSS). The second level of plate metal electrode PM2 is (vertically) configured/disposed on the first level of plate metal electrode PM1 and coupled to the first terminal T1 (VDD). The isolation layer IL2 is located between the first level of plate metal electrode PM1 and the second level of plate metal electrode PM2.

Besides, the interdigitated metal capacitor CI' includes a first level of interdigitated metal electrode IM1, a second level of interdigitated metal electrode IM2, and an isolation layer IL3. The first level of interdigitated metal electrode IM1 and the first level of plate metal electrode PM1 are located in the same metal layer. The first level of interdigitated metal electrode IM1 is configured/disposed on the poly-silicon layer POS, and coupled to the second terminal T2 (VSS). The second level of interdigitated metal electrode IM2 and the second level of plate metal electrode PM2 are located in the same metal layer. The second level of interdigitated metal electrode IM2 is (vertically) configured/disposed on the first level of interdigitated metal electrode IM1, and coupled to the first terminal T1 (VDD). The isolation layer IL3 is located between the first level of interdigitated metal electrode IM1 and the second level of interdigitated metal electrode IM2.

Similarly, the plate metal capacitor CP' and the interdigitated metal capacitor CI' with different structures are fabricated/formed above the MOS capacitor CM'. Thereby, due to the relatively large cross-section area of the multi-level plate metal capacitor, the capacitor structure 10' described in this embodiment has a relatively large amount of current flow in comparison with the capacitor structure merely equipped with the interdigitated metal capacitor, given that the available chip area in these two capacitor structures is the same. In addition, the circumference of the multi-level interdigitated metal capacitor is relatively long. Therefore, given that the available chip area in the capacitor structure 10' described in this embodiment and the available chip area in the capacitor structure merely having the plate metal capacitor remain unchanged, the capacitance of the capacitor structure described in this invention can reach the design value even though the chip area is confined.

Certainly, the number of levels of the plate metal capacitor and the number of levels of the interdigitated metal capacitor can be adaptively changed corresponding to various fabricating techniques based on actual design requirements. In addition, subject to a confined chip area, the layout area of the plate metal capacitor and the layout area of the interdigitated metal capacitor can be determined based on the actual design requirements. Therefore, the exemplified embodiments described above are not to limit the invention.

In light of the foregoing, a multi-level plate metal capacitor and a multi-level interdigitated metal capacitor are fabricated above the MOS capacitor in the capacitor structure described in the invention. Thereby, due to the relatively large cross-section area of the multi-level plate metal capacitor, the capacitor structure described in the invention has a relatively large amount of current flow in comparison with the capacitor structure merely equipped with the interdigitated metal capacitor, given that the available chip area in these two capacitor structures is the same. In addition, the circumference of the multi-level interdigitated metal capacitor is relatively long. Therefore, given that the available chip area in the capacitor structure of this invention and in the capacitor structure merely having the plate metal capacitor remains unchanged, the capacitance of the capacitor structure described in this invention can reach the design value even though the chip area is confined.

What are described above are only embodiments of the invention and do not limit the scope of the invention. Simple and equivalent variations and modifications according to the claims and specification of the invention are still within the scope of the claimed invention. In addition, each of the embodiments and claims does not have to achieve all the advantages or characteristics which are disclosed in the invention. Moreover, the abstract and title only serve to facilitate search of patent documents and are not intended in any way to limit the scope of the claimed invention.

What is claimed is:

1. A capacitor structure applied to an integrated circuit, the capacitor structure comprising:
    a metal-oxide semiconductor capacitor having a first terminal and a second terminal; and
    two metal capacitors comprising a first metal capacitor and a second metal capacitor, wherein the first metal capacitor does not comprise a finger-like structure, the second metal capacitor comprises the finger-like structure, and the two metal capacitors are formed above the metal-oxide semiconductor capacitor and respectively coupled between the first terminal and the second terminal,
    wherein a first level of metal electrode of the first metal capacitor and a first level of metal electrode of the second metal capacitor are located in a same first metal layer,
    wherein a second level of metal electrode of the first metal capacitor and a second level of metal electrode of the second metal capacitor are located in a same second metal layer, wherein the second metal layer is located above the first metal layer.

2. The capacitor structure as recited in claim 1, wherein the metal-oxide semiconductor capacitor is implemented by a metal-oxide semiconductor transistor.

3. The capacitor structure as recited in claim 2, wherein the metal-oxide semiconductor transistor is a P-type metal-oxide semiconductor transistor, and the P-type metal-oxide semiconductor transistor comprises:
    an N-well;

a first P-type doped area located in the N-well and coupled to the first terminal so as to serve as a drain of the P-type metal-oxide semiconductor transistor;

a second P-type doped area located in the N-well and coupled to the first terminal so as to serve as a source of the P-type metal-oxide semiconductor transistor;

at least one N-type doped area located in the N-well and coupled to the first terminal so as to serve as a body of the P-type metal-oxide semiconductor transistor;

a poly-silicon layer located on the N-well and coupled to the second terminal so as to serve as a gate of the P-type metal-oxide semiconductor transistor; and a first isolation layer located between the N-well and the poly-silicon layer.

4. The capacitor structure as recited in claim 3, wherein the first level of metal electrode of the first metal capacitor is a first level of plate metal electrode located on the poly-silicon layer and coupled to the first terminal, the second level of metal electrode of the first metal capacitor is a second level of plate metal electrode located on the first level of plate metal electrode and coupled to the second terminal, and the first metal capacitor further comprises:

a second isolation layer located between the first level of plate metal electrode and the second level of plate metal electrode.

5. The capacitor structure as recited in claim 4, wherein the first level of metal electrode of the second metal capacitor is a first level of interdigitated metal electrode located on the poly-silicon layer and coupled to the first terminal, the second level of metal electrode of the second metal capacitor is a second level of interdigitated metal electrode located on the first level of interdigitated metal electrode and coupled to the second terminal, and the second metal capacitor further comprises:

a third isolation layer located between the first level of interdigitated metal electrode and the second level of interdigitated metal electrode.

6. The capacitor structure as recited in claim 5, wherein the first terminal is configured to be coupled to a first voltage, the second terminal is configured to be coupled to a second voltage, and the first voltage is higher than the second voltage.

7. The capacitor structure as recited in claim 2, wherein the metal-oxide semiconductor transistor is an N-type metal-oxide semiconductor transistor, and the N-type metal-oxide semiconductor transistor comprises:

a P-type substrate;

a first N-type doped area located in the P-type substrate and coupled to the second terminal so as to serve as a drain of the N-type metal-oxide semiconductor transistor;

a second N-type doped area located in the P-type substrate and coupled to the second terminal so as to serve as a source of the N-type metal-oxide semiconductor transistor;

at least one P-type doped area located in the P-type substrate and coupled to the second terminal so as to serve as a body of the N-type metal-oxide semiconductor transistor;

a poly-silicon layer located on the P-type substrate and coupled to the first terminal so as to serve as a gate of the N-type metal-oxide semiconductor transistor; and a first isolation layer located between the P-type substrate and the poly-silicon layer.

8. The capacitor structure as recited in claim 7, wherein the first level of metal electrode of the first metal capacitor is a first level of plate metal electrode located on the poly-silicon layer and coupled to the second terminal, the second level of metal electrode of the first metal capacitor is a second level of plate metal electrode located on the first level of plate metal electrode and coupled to the first terminal, and the first metal capacitor further comprises:

a second isolation layer located between the first level of plate metal electrode and the second level of plate metal electrode.

9. The capacitor structure as recited in claim 8, wherein the first level of metal electrode of the second metal capacitor is a first level of interdigitated metal electrode located on the poly-silicon layer and coupled to the second terminal, the second level of metal electrode of the second metal capacitor is a second level of interdigitated metal electrode located on the first level of interdigitated metal electrode and coupled to the first terminal, and the second metal capacitor further comprises:

a third isolation layer located between the first level of interdigitated metal electrode and the second level of interdigitated metal electrode.

10. The capacitor structure as recited in claim 9, wherein the first terminal is configured to be coupled to a first voltage, the second terminal is configured to be coupled to a second voltage, and the first voltage is higher than the second voltage.

11. The capacitor structure as recited in claim 1, wherein the first level of metal electrode of the first metal capacitor and the first level of metal electrode of the second metal capacitor are coupled to one of the first terminal and the second terminal, wherein a second level of metal electrode of the first metal capacitor and a second level of metal electrode of the second metal capacitor are coupled to the other one of the first terminal and the second terminal.

12. The capacitor structure as recited in claim 1, wherein the first metal capacitor is a multi-level plate metal capacitor, and the second metal capacitor is a multi-level interdigitated metal capacitor.

13. A capacitor structure applied to an integrated circuit, the capacitor structure comprising:

a metal-oxide semiconductor capacitor having a first terminal and a second terminal; and two metal capacitors comprising a first metal capacitor and a second metal capacitor, wherein the first metal capacitor does not comprise a finger-like structure, the second metal capacitor comprises the finger-like structure, and the two metal capacitors are formed above the metal-oxide semiconductor capacitor and respectively coupled between the first terminal and the second terminal, wherein a first level of metal electrode of the first metal capacitor and a first level of metal electrode of the second metal capacitor are directly coupled to the metal-oxide semiconductor capacitor.

14. The capacitor structure as recited in claim 13, wherein the first metal capacitor is a multi-level plate metal capacitor, and the second metal capacitor is a multi-level interdigitated metal capacitor.

* * * * *